United States Patent
Peale et al.

(10) Patent No.: US 6,580,733 B1
(45) Date of Patent: Jun. 17, 2003

(54) ANALOG PULSE POSITION MODULATION IN HARMONICALLY MODE-LOCKED LASERS

(75) Inventors: Robert E. Peale, Oviedo, FL (US); Andrei V. Muravjov, Orlando, FL (US); Remco C. Strijbos, Orlando, FL (US); Chris J. Fredricksen, Orlando, FL (US); Sandra H. Withers, Orlando, FL (US)

(73) Assignee: University of Central Florida, Orlando, FL (US)

( * ) Notice: Subject to any disclaimer, the term of this patent is extended or adjusted under 35 U.S.C. 154(b) by 0 days.

(21) Appl. No.: 09/448,627

(22) Filed: Nov. 24, 1999

Related U.S. Application Data
(60) Provisional application No. 60/118,271, filed on Feb. 2, 1999.

(51) Int. Cl.$^7$ ............................... H01S 3/10; H01S 3/98
(52) U.S. Cl. ............................... 372/26; 372/20; 372/18; 372/37
(58) Field of Search ............................... 372/18, 26, 37, 372/20

(56) References Cited

U.S. PATENT DOCUMENTS

| | | | |
|---|---|---|---|
| 3,102,959 A | 9/1963 | Diemer | 250/211 |
| 3,935,543 A | 1/1976 | Eguchi et al. | 331/94.5 |
| 4,314,210 A | 2/1982 | Everett | 372/18 |
| 4,375,684 A | 3/1983 | Everett | 372/18 |
| 4,390,991 A | 6/1983 | Pearson | 372/21 |
| 4,504,950 A | 3/1985 | AuYeung | 372/20 |
| 4,530,573 A | 7/1985 | Wolkstein | 350/358 |
| 4,602,342 A | 7/1986 | Gottlieb et al. | 364/498 |
| 4,805,694 A | 2/1989 | Rosen et al. | 363/147 |
| 4,906,069 A | 3/1990 | Brandstetter et al. | 350/162.12 |
| 5,120,961 A | 6/1992 | Levin et al. | 250/339 |
| 5,784,397 A | 7/1998 | Kim et al. | 372/43 |
| 6,222,861 B1 * | 4/2001 | Kuo et al. | 372/20 |

OTHER PUBLICATIONS

*Charging Effects in Mode–locked THz p–Ge Lasers*, R. C. Strijbos et al., Sep. 1993.

*Pulse Separation Control for Mode–locked Far–infrared p–Ge Lasers*, A. V. Muravjov et al., Institute for Physics of Microstructures, Russian Academy of Sciences, Novgorod, Russia.

*Mode–locked far–infrared p–Ge Laser Using an Offset rf Electric Field for Gain Modulation*, A. V. Muravjov et al., Institute for Physics of Microstructures, Russian Academy of Sciences, Novgorod, Russia, Feb. 2, 1998.

(List continued on next page.)

*Primary Examiner*—Paul Ip
*Assistant Examiner*—Cornelius H. Jackson
(74) *Attorney, Agent, or Firm*—Brian S. Steinberger; Law Offices of Brian S. Steinberger, P.A.

(57) ABSTRACT

Analog pulse position modulation of pulsed emission from a laser, which is actively and harmonically mode-locked. The laser requires: a body of an active gain medium; means for changing the gain as a function of a controllable parameter; harmonically and actively mode-locking the laser by fast periodic changes of said parameter; and superimposing slower changes on the parameter whereby the fast periodic parameter changes can be continuously shifted between the peak and the shoulder of the gain-vs-parameter curve. As proof of concept, electric control of the separation between two interleaved pulse trains from a far-infrared (1.5–4 THz) p-Ge laser, which is actively mode-locked by rf gain modulation at the second harmonic of the roundtrip frequency, is demonstrated by changing the electric bias at the rf contacts. A suggested application is telemetry using analog pulse position modulation.

14 Claims, 5 Drawing Sheets

OTHER PUBLICATIONS

*Actively Mode–locked THz p–Ge Hot–hole Lasers with Electric Pulse–separation Control and Gain Control*, R. C. Strijbos, et al., Institute for Physics of Microstructures, Russian Academy of Sciences, Novgorod, Russia.

*Mode Locking of Far–infrared P–Ge Lasers*, R. C. Strijbos et al., Int. Conf. on THz Electron, Sep. 3, 1998.

*Pulse Separation Control for Mode–locked Far–infrared p–Ge Lasers*, A. V. Muravjov,et al., American Institute of Physics, vol. 74, No. 2, Jan. 11, 1999.

*Generation of Far–infrared Radiation by Hot Holes in Germanium and Silicon in E_H Fields*, I. E. Vorobjejev et al, Optical and Quantum Electronics, vol. 23, 1991, pp s221–s229.

* cited by examiner

ANALOG PULSE POSITION MODULATION IN HARMONICALLY MODE-LOCKED LASERS

This invention relates to lasers, and in particular to an apparatus and method for generating analog pulse position modulation by means of a harmonically mode-locked laser and its use as a transmitter of information; this Application claims priority from U.S. Provisional Application Serial No. 60/118,271 filed Feb. 2, 1999; and, this invention was funded in part by the National Science Foundation contract ECS9522267 and AFOSR/BMDO contract F49520-0434.

BACKGROUND AND PRIOR ART

There has been progress in the operation of telemetry systems in the far infrared wavelength region by use of p-Ge mode-locked lasers. Mode-locked lasers are well known as seen from numerous United States Patent Nos. including: U.S. Pat. No. 4,314,210 entitled Mode-Locking And Chirping System For Lasers; U.S. Pat. No. 4,375,684 entitled Laser Mode locking, Q-Switching And Dumping System; and U.S. Pat. No. 4,504,950 entitled Tunable Graded Rod Laser Assembly.

Mode-locked lasers have also been widely used for optical data transmission as seen in Publications including: Zhu, K. O. Nyairo and I. H. White, "Dual-wavelength picosecond optical pulse generation using an actively mode-locked multichannel grating cavity laser," Photon. Tech. Lett., Vol.6, No.3, 348–351, 1994; C. L Wang and C-L Pan, "Dual-wavelength actively modelocked laser-diode array with all external grating-loaded cavity", Optics Lett., vol.19, 1456–1458, 1994; and U.S. Pat. No. 3,935,543 entitled Laser Mode Locking And Coupling Method And Apparatus. In this last referenced Patent, it teaches of mode locking by phase modulation using an intracavity electrooptic crystal and use of this crystal as a fast gate to allow single pulses, or groups of pulses, out of the laser cavity. This achieves digital pulse code modulation to create a binary representation of a data signal.

The use of an optical communication system in which pulse position modulation(ppm) is achieved with a mode-locked laser with a mode-locking frequency equal to the time slot frequency of the modulation is described in U.S. Pat. No. 4,584,720 entitled Optical Communication System Using Pulse Position Modulation. This approach selects single pulses of optical energy to output from the laser cavity from the evenly spaced train of pulses circulating within the cavity. Control over which pulse to output is made by external electronic counters driven by a requisite external clock operating at the time-slot frequency. The temporal position of the output pulse with respect to the external clock pulse takes only discrete values. By choosing different pulses to output, different discrete delays of the output pulses with respect to the clock pulse can be realized, allowing a representation of a data signal via digital pulse modulation. Both the transmitter and receiver require synchronous clocks. A further example of the disadvantageous requisite external clocks at both the transmitter and the receiver is shown in U.S. Pat. No. 5,539,761 wherein there is disclosed generating a mode-locked pulse stream from a semiconductor laser using an oscillating resonant tunneling diode (RTD) to periodically circuit to bias and mode-lock the laser. PPM is realized by phase shifting the RTD circuit oscillations with respect to an external clock. The difficulties in synchronizing mode-locked laser output to an external clock are discussed.

SUMMARY OF THE INVENTION

The first objective of the present invention is to provide an actively mode-locked laser with analog pulse position modulation.

The second object of this invention is to provide analog pulse position modulation photon generation from a harmonically mode-locked laser source.

The third object of this invention is to provide analog pulse position modulation of far infrared photon generation from a harmonically mode-locked monocrystalline p-Ge laser diode.

The fourth objective is to is to develop a harmonically mode-locked laser source that will be appropriate for transmitting analog pulse position modulated pulses of optical energy and in particular far infrared radiation for advanced telecommunications and signal processing applications.

In a preferred embodiment of the invention described as analog pulse position modulation in harmonically mode-locked lasers, the laser must: have an active gain medium, whose gain changes as a function of a controllable parameter, and the gain-vs-parameter curve must display a maximum at some accessible value of the parameter; be harmonically and actively mode-locked by fast periodic changes of the controllable parameter at some even harmonic of the cavity round trip time resulting in a corresponding modulation of the gain; and, have means to impose a slow variation of the controllable parameter simultaneous to its fast periodic changes in such a way that the fast periodic gain change can be continuously shifted with respect to the peak of the gain-vs-parameter curve. The net result of the invention is a set (two, or a multiple of two) of interleaved, periodic, output pulse trains of optical energy whose relative temporal position (not frequency) can be varied as a function of the controllable parameter. This is an embodiment of pulse position modulation (PPM) without requirement of an external clock at the transmitter or receiver (a current disadvantage of present systems), and one in which the relative position of the interleaved pulse trains can be varied continuously rather than in discrete jumps.

Further objects and advantages of this invention will be apparent from the following detailed description of a presently preferred embodiment, which is illustrated schematically in the accompanying drawings and its embodiment as a transmitter.

DESCRIPTION OF THE PREFERRED EMBODIMENT

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

Considering now the laser terminology used herein in describing the conditions imposed on the laser to produce analog pulse position modulation of the output radiation, the term active gain medium means that material which when pumped develops a population inversion and stimulated emission of photons. Well known examples of such media include carbon dioxide gas, helium-neon mixture, semiconductor pn junction and neodymium doped YAG. The preferred medium of the invention is a p-Ge monocrystalline body in crossed electron and magnetic fields. Electric fields are applied to p-Ge by applying a voltage to ohmic contacts attached to the p-Ge crystal. Magnetic fields are applied to the p-Ge crystal by using external electromagnets or permanent magnets such as NdFeB.

All known active gain medias have a gain which changes as a function of at least one controllable parameter, e.g., the gain of a semiconductor junction laser generally depends on the temperature and the gain of the helium-neon mixture depends on the pressures and relative concentrations of the component gases.

Figure 1:
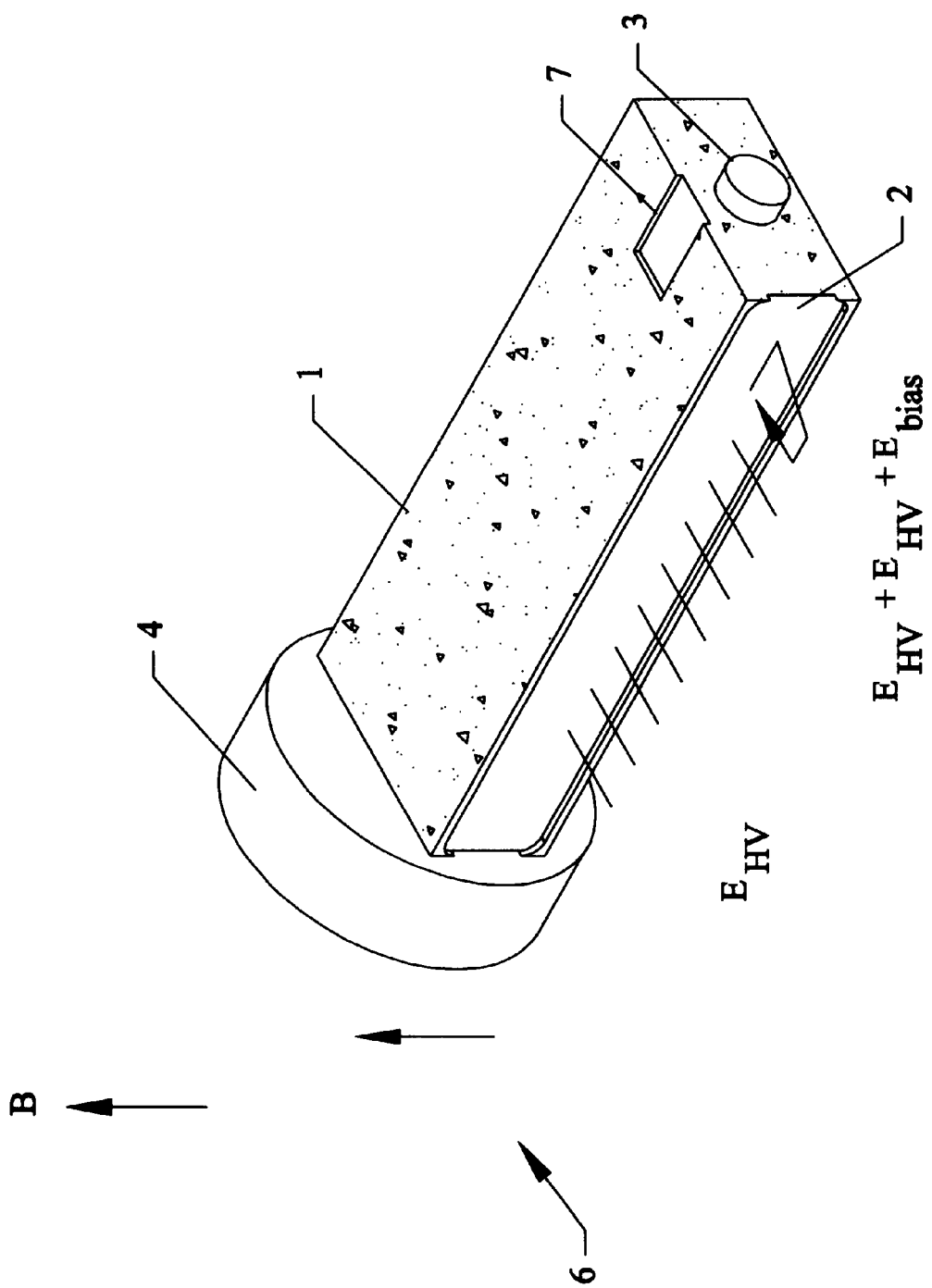
FIG. 1 illustrates a p-Ge laser crystal with applied fields and mirrors.

For the p-Ge laser, the controllable parameter is the angle between the applied electron field and the applied magnetic field 6 at one end of the crystal 1 (see FIG. 1). When this angle=90 degrees, the gain in this portion of the active crystal 1 is maximum such that the gain-vs-parameter curve displays a maximum when plotted over the accessible values of the parameter. The direction of the total applied electric field vector is determined by the vector sum of the electric field vector EHV 5, applied through the main contacts 2 and the electric field vector E bias 9 applied through the small additional contacts 7. The angle between the resultant electric field vector and the magnetic field 6 can be shifted from 90 degrees by the application of a suitable bias electric field E bias 9 to the small contacts 7 such that the gain can be shifted away from its peak value on the gain-vs-parameter curve.

Independently, a suitable rf field Erf 8 can be applied via the small contacts to modulate the angle, and hence gain, in order to achieve active mode-locking of the laser emission. For harmonic active mode locking, the gain at the end of the active p-Ge crystal is modulated twice(or a higher integer multiple) per round-trip period for photons traveling back and forth between the cavity mirrors, which define the cavity length.

It has been found that superimposing simultaneously the slowly varying bias E bias 9 onto the radio frequency (rf) modulation provides means to continuously shift from the shoulder of the gain-vs-parameter curve to its peak when the laser is harmonically mode-locked which provides an analog pulse position modulation photon output. Harmonic mode-locking results in 2 or a higher integer, output pulses per cavity round trip period. In this regard, the cavity round trip period is critical and is determined by the distance between the two mirrors(back mirror 4 and output coupler 3) rather than the length of the crystal body since a spacer can sometimes be used in the cavity enclosing the laser crystal.

As earlier noted, FIG. 1 illustrates a preferred p-Ge laser crystal 1 with applied fields and mirrors. To provide the structure of FIG. 1, the crystal 1 was prepared by cutting a single-crystal, Ga-doped, p-Ge with a concentration of $7 \times 10^{13}$ cm$^{-3}$ into the form of a rectangular bar with a cross section of 5×7 mm$^2$ and a length of 84.2 mm. Ohmic contacts 2 were made by Al evaporation and subsequent annealing at opposite lateral sides of the crystal 1, and then covered with indium. The crystal ends were polished parallel to each other within one arcminute accuracy and two external copper mirrors 3 and 4 were attached to them via 20 um Teflon film. Electric field pulses (E) 5 were applied to the active crystal using a low duty-cycle thyratron pulser via ohmic contacts 2 on opposite 5×84.2 mm$^2$ sides of the crystal. The active crystal 1 with attached mirrors 3 and 4 was installed inside a superconducting solenoid with tunable magnetic field 6 up to 3 T oriented along the long crystal axis, such that the orientations of fields 5 and 6 were E 11 [110] and (B) II [111]. The entire system was immersed in liquid helium at 4 K. Magnetic fields 6 up to 1.4 T were applied in Voigt geometry using a room-temperature electromagnet (Walker Scientific HF-9F) external to the cryostat (Janis 8DT). Radiation was conducted out of the top of the cryostat using a brass light pipe sealed with a Teflon lens. The laser emission was detected by a fast Schottky diode (University of Virginia) and recorded on a 4.5 GHz transient digitizer (Tektronix SCD5000).

Small additional contacts 7 with a length of 4 mm and 1 mm separation were evaporated on the lateral sides of the crystal. By placing these contacts 7 perpendicular to the main contacts 2 at one end of the crystal 1, there is provided an additional field 9 E bias 11 B which allows for local regulation of the orientation of the total electric field at this end of the crystal. In addition an rf field Erf 8 can be applied to the small contacts 7. In this way, the orientation of the total electric field can be regulated (by changing the bias) and/or modulated (by applying rf power) at one end of the laser crystal 1. By choosing a crystal length of 84.2 mm, an rf frequency (vrf)(where v="nu") near 450 MHz, which can be obtained in adequate powers from relatively cheap ham-radio electronics, can be used, such that the cavity roundtrip frequency (vrt) equals vrf(where v="nu".

Figure 2:
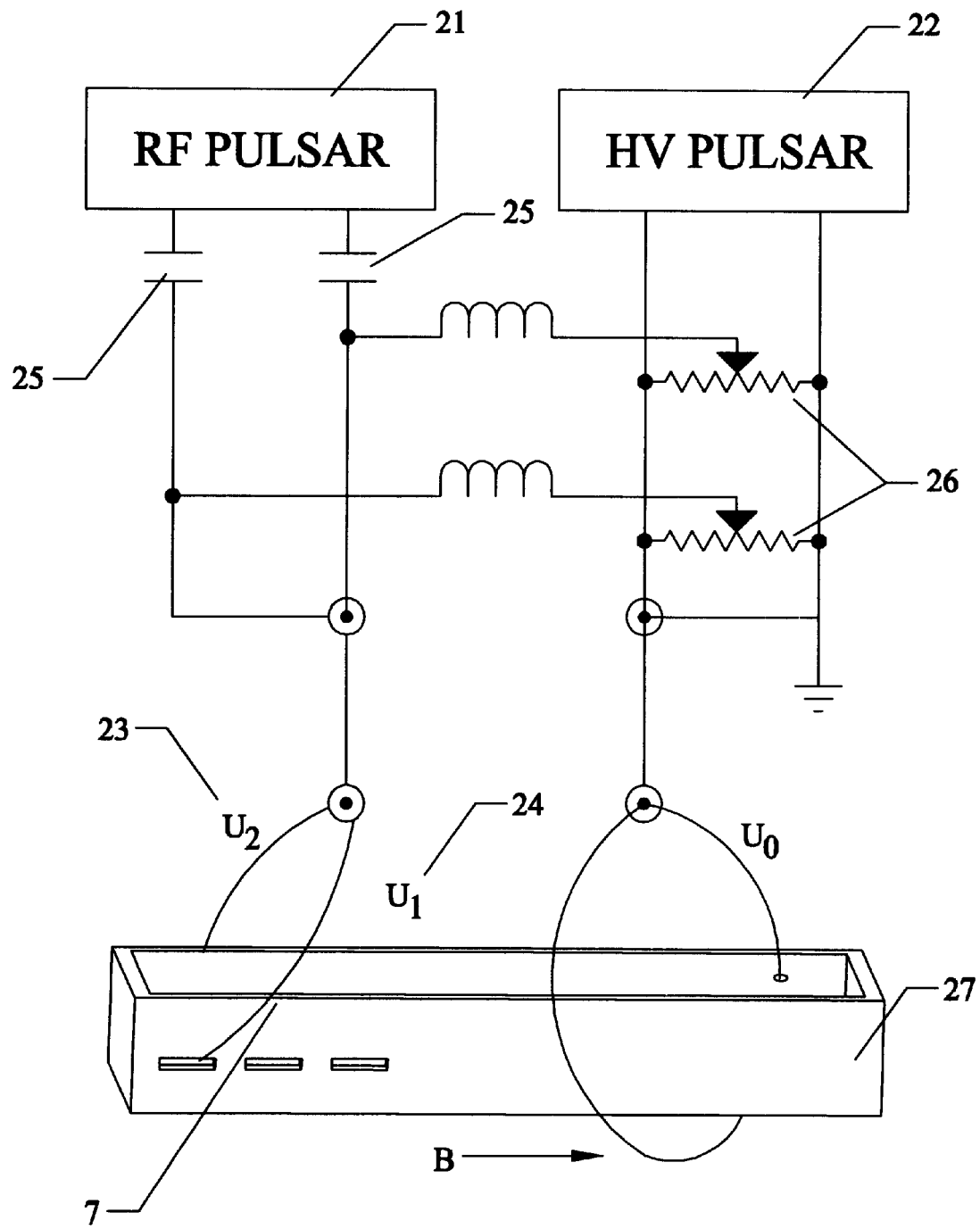
FIG. 2 illustrates the electronic set up whereby the analog pulse position modulation of far infrared radiation was produced.

The electronic setup for the experimental studies is illustrated in FIG. 2. The radio frequency system assembled for the experiments produces clean sub-us pulses which just overlap the HV pulses to prevent heating of the laser crystal by the rf. Since the impedance of the crystal between the rf contacts is low, high rf power is required, in part to overcome the unavoidable imperfect impedance match to the dynamic load. The rf Pulser 21 consists of a tunable General Radio 1362 UHF oscillator which delivers about 0.3 W continuous wave signal that is frequency stable within a few tens of kHz. A directional coupler feeds a fraction of this signal to a Stanford Model 5R620 frequency counter to precisely and accurately monitor the rf frequency. The main part goes to a Minicircuits Model 15542 PIN diode switch controlled by 8 V signals from a home built controller, that itself is driven by standard TTL Pulses from a Stanford DG 535 pulse generator. From the switch, low duty-cycle rf bursts enter a GE MASTR II solid state power amplifier with gain control to give up to 40 W. This is fed to a Henry Radio Model 2004A tube amplifier to give up to 800 W. A Microwave Device 318N3 directional coupler with Hewlett Packard 420A crystal detectors monitor forward and reflected rf power. Power measurements were verified by direct observation of the rf voltage on a fast oscilloscope. Simple isolation capacitors 25 were used to improve impedance match to the dynamic load and protect HV and rf systems from each other. Additionally, a bias voltage [U2 minus U1] can be supplied to the small contacts from the main high voltage pulser 22 by setting the potentials U2 (23) and U1 (24) using two variable voltage dividers 26. The applied bias field Ebias 9 is calculated by (U1–U2)/d, where d is the distance between the small additional contacts(equal to the relevant cross-sectional dimensions of the crystal.

Figure 3:
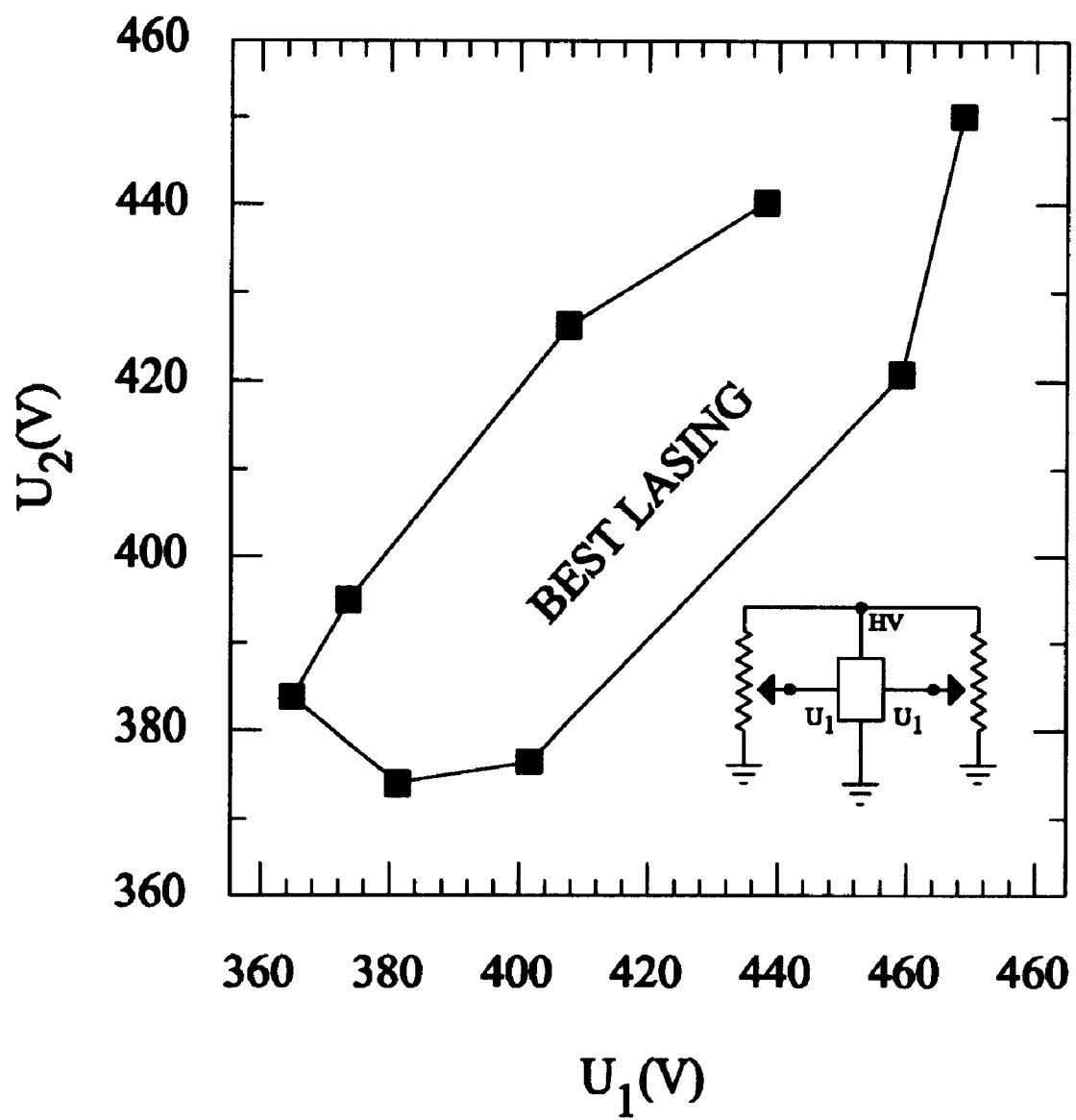
FIG. 3 shows the Lasing Domain in U1 and U2 space when the U1 and U2 are controllable bias voltages applied to small contacts of the crystal.

A measurement of the range of potentials U1 and U2 at the additional contacts 7 of the harmonically mode-locked crystal 27 positioned within its cavity mirrors 3 and 4 is plotted in FIG. 3. The open circle indicates the operating point without bias circuit attached. The difference of U2 minus U1 determines the applied Ebias, which might not directly give the magnitude of the electric field component El along the magnetic field 6 direction inside the crystal, and El=0 might not exactly occur for U2=U1, as misalignment of the rf contacts might cause an offset. But the narrow width of the lasing region confirms the strong dependence of the gain on El and the existence of a maximum in the gain-vs-bias curve for accessible values of Ebias 9; changing U2 minus U1 over + to −50 V from its optimum value brings the laser below threshold. Moreover, it is found that the operating point without external bias (indicated by the open circle) lies on the border of this region and a voltage of about 15 V is necessary to move to the center of the lasing region with the highest small signal-gain.

Figure 4:
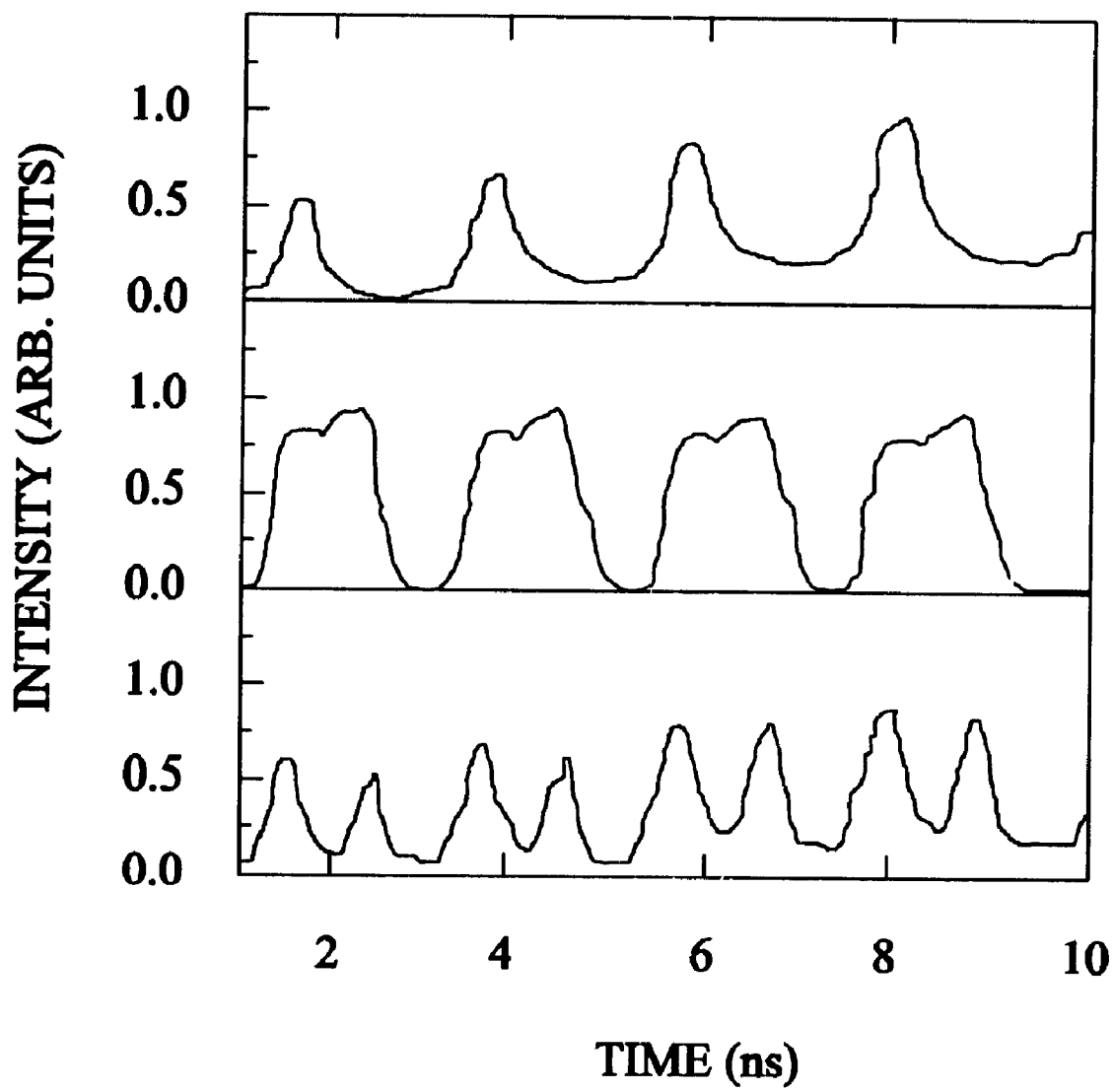
FIG. 4 shows the experimentally observed mode-locked laser emission from three different values of applied bias.

As earlier noted, FIG. 4 presents experimentally observed mode-locked laser emission in accordance with the teachings of this invention for three different values of applied bias. For a 84.2 mm p-Ge laser crystal, the round trip time of 2.20 ns gives a resonance frequency of 453.8 MHz for harmonic mode-locking with the necessary maintaining of two circulating pulses within the cavity. When the bias Ebias 9 is changed by changing the potentials U1 and U2(23 and 24) using the voltage dividers 26, the output of the actively mode-locked laser changes drastically, as can be seen in FIG. 4 where the output pulse train is plotted for different settings of the external bias Ebias 9. At zero external bias, the two independent pulses coincide in the cavity, and a train of pulses of optical energy separated by the round trip time is emitted. The detected signal in this case is the same as that for simple(non-harmonic) modelocking, where a single pulse travels to and fro within the resonator cavity and partially coupled out it time it hits the outcoupling mirror. When the external bias is increased, the two independent pulses within the cavity begin to separate. A further increase in bias causes further separation of the pulses until they are fully resolved (bottom) and time between pulses is approximately half the round trip time of the laser cavity.

Figure 5:
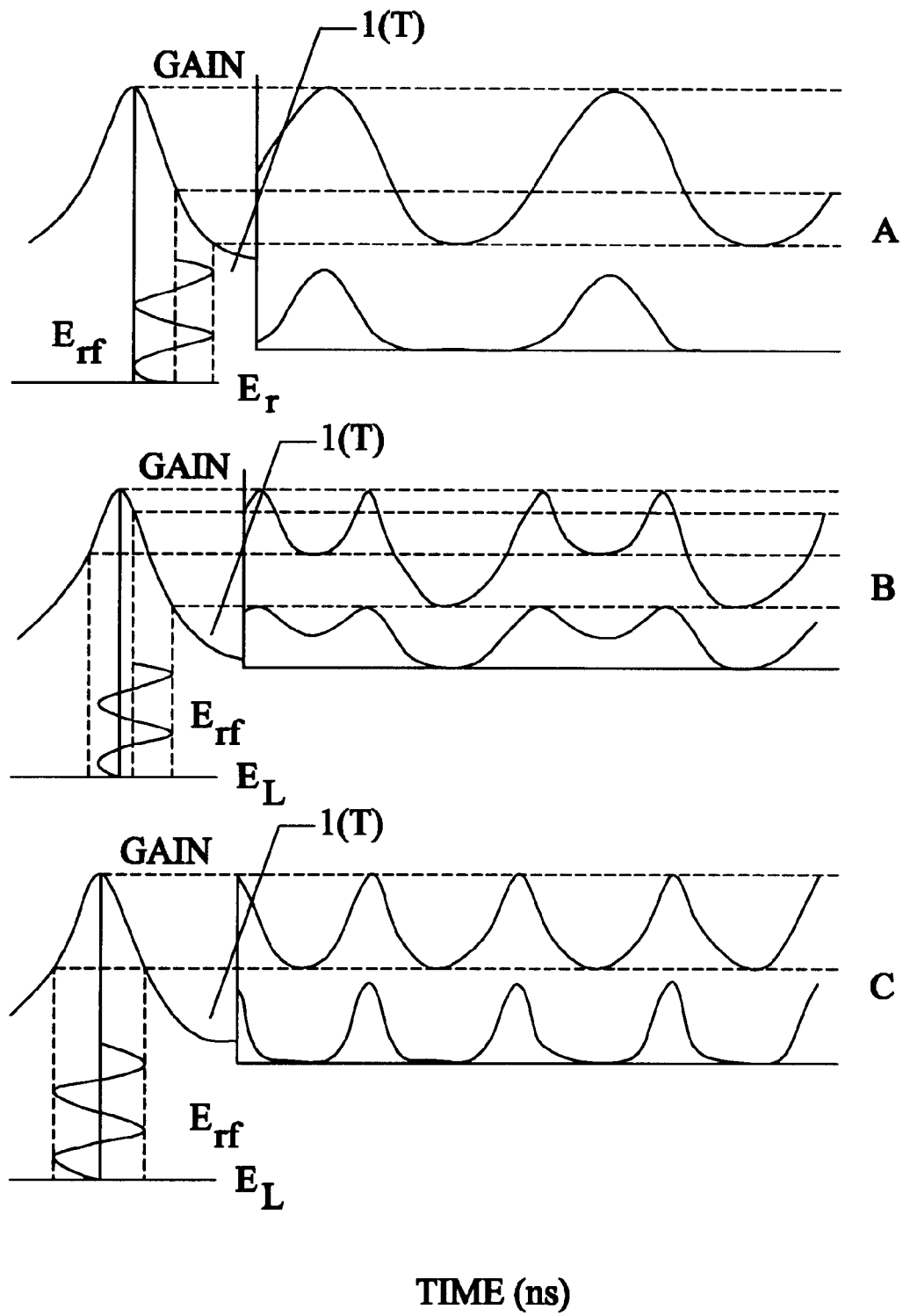
FIG. 5 illustrates bias effect on the pulse control of laser emissions.

The plots of FIG. 5 explain the effect of the bias field Ebias 9 on the control of laser pulse timing. The three situations shown in FIG. 5 mimic the experimental results in FIG. 4. They correspond to (A) a large offset: modulation far from peak of gain-vs-El, (B) a small offset: modulation close to the peak of gain-vs-El curve, and (C) zero offset: modulation at peak of gain-vs-El curve. As a reminder, El is the component of the total electric field vector internal to the crystal that is parallel to the applied magnetic field 6. The magnitude of El is changed by the applied bias field E bias 9.

Changing the bias field Ebias of an actively and harmonically mode-locked P—Ge laser yields precise control of gain modulation characteristics and allows for optimization of shortest pulses or change of the time delay between two independent pulses in a laser mode-locked at the second harmonic. It is unique in providing analog pulse position modulation photon output. This is achieved without requiring: any electro-optical device; any acousto-optical device; self pulsation or passive mode-locking; any change in index of refraction; any change in laser wavelength; Bragg reflector; resonance tunneling or step recovery diode; gain switching; saturable absorption; modulation of the laser's cavity optical length; and, any phase or frequency variation in the time dependence of the applied periodic perturbation used to achieve mode-locking.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. An analog pulse position modulation mode-locked laser comprising:
    a laser body having an active gain medium within a cavity;
    means for changing the gain of said medium as a function of a controllable parameter;
    means for harmonically and actively mode-locking said laser by fast periodic changes of said parameter at a harmonic of a roundtrip frequency of said cavity; and,
    means for superimposing a slow variation of said parameter simultaneously onto fast periodic changes which are continuously shifted from a shoulder of the gain-vs-parameter curve to a peak value.

2. The laser of claim 1, wherein the changing gain means and the actively mode-locking means includes: a single means.

3. The laser of claim 1, comprising means for controlling said parameter near the gain-vs-parameter maximum at an accessible value of said parameter.

4. The laser of claim 1, wherein said laser body includes:
    an active p-Ge crystal in crossed electron and magnetic fields.

5. The laser of claim 4, wherein said cavity includes: a length suitable for the active mode-locking at an even harmonic of the cavity roundtrip frequency.

6. The laser of claim 4, further comprising:
    means for applying a high voltage on two sides of said crystal;
    a radio frequency voltage applied parallel to an applied magnetic field whereby harmonic mode-locking of said crystal is achieved; and
    a frequency-controllable slower frequency electric bias is superimposed on said radio frequency whereby an analog pulse position modulation of the output pulses of far infrared energy of said laser is realized.

7. The laser of claim 1, wherein said laser is a Gallium doped p-Ge single crystal.

8. A method of producing an analog pulse position modulation laser beam comprising the steps of:
    disposing an active gain medium of an active p-Ge single crystal in crossed electron and magnetic fields, in a laser cavity, said cavity having a length such that an applied radio frequency perturbation of gain produces a harmonic active mode-locking of said laser radiation;
    controlling a parameter upon which gain depends;
    applying said radio frequency perturbation of gain to said medium while simultaneously superimposing a lower frequency perturbation of gain on said applied radio frequency perturbation of gain for producing an analog pulse position modulated laser beam; and
    collecting said beam outside of said laser cavity.

9. The method of claim 8, wherein the changing gain means and the active mode-locking means includes a single means.

10. The method of claim 8, including the step of:
    controlling said parameter adjacent to a maximum in a gain-vs-parameter curve.

11. The method of claim 9 wherein said cavity includes: a length suitable for the active mode-locking at an even harmonic of the cavity roundtrip frequency.

12. An analog pulse position modulation mode-locked laser comprising:

a gain medium of p-Ge within a cavity;

means for changing the gain of said gain medium as a function of a controllable parameter;

means for harmonically and actively mode-locking said laser by changes of said parameter at a harmonic of a roundtrip frequency of said cavity; and means for superimposing a variation of said parameter simultaneously onto the changes whereby said changes can be continuously shifted.

13. The laser of claim 12, wherein the p-Ge includes:

an active p-Ge crystal in crossed electrons and magnetic fields.

14. The laser of claim 12, wherein the p-Ge includes:

a Gallium doped p-Ge single crystal.

* * * * *